(12) United States Patent
Basker et al.

(10) Patent No.: US 12,745,615 B2
(45) Date of Patent: Sep. 22, 2026

(54) ISOLATION MODULE FORMATION FOR BACKSIDE POWER DELIVERY APPLICATION

(71) Applicant: Applied Materials, Inc., Santa Clara, CA (US)

(72) Inventors: Veeraraghavan S. Basker, Fremont, CA (US); Kyoung Ha Kim, Cupertino, CA (US); Byeong Chan Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 350 days.

(21) Appl. No.: 18/652,947

(22) Filed: May 2, 2024

(65) Prior Publication Data

US 2024/0379438 A1 Nov. 14, 2024

Related U.S. Application Data

(60) Provisional application No. 63/465,572, filed on May 11, 2023.

(51) Int. Cl.

| | |
|---|---|
| ***H10W 20/00*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(52) U.S. Cl.

CPC ........ *H10W 20/023* (2026.01); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search

None

See application file for complete search history.

(56) References Cited

U.S. PATENT DOCUMENTS

| | | | |
|---|---|---|---|
| 2017/0098608 A1 | 4/2017 | Jung | |
| 2018/0033718 A1 | 2/2018 | Kaltalioglu et al. | |
| 2018/0294267 A1 | 10/2018 | Licausi et al. | |
| 2019/0123140 A1 | 4/2019 | Park et al. | |
| 2021/0134721 A1 | 5/2021 | Chiang et al. | |
| 2021/0217699 A1 | 7/2021 | Zhu et al. | |
| 2023/0369419 A1* | 11/2023 | Lee | H10D 30/014 |

FOREIGN PATENT DOCUMENTS

| | | |
|---|---|---|
| CN | 113206062 A | 8/2021 |

* cited by examiner

*Primary Examiner* — Kyoung Lee

(74) *Attorney, Agent, or Firm* — Servilla Whitney LLC

(57) ABSTRACT

Semiconductor devices and methods of manufacturing the same are described. The method includes combining selective recess of a sacrificial layer and isotropic etching of a silicon layer in order to form a protective cap that will allow the silicon layer of the substrate to be etched without affecting the sacrificial layer.

20 Claims, 7 Drawing Sheets

ISOLATION MODULE FORMATION FOR BACKSIDE POWER DELIVERY APPLICATION

CROSS-REFERENCE TO RELATED APPLICATIONS

This application claims priority to U.S. Provisional Application No. 63/465,572, filed May 11, 2023, the entire disclosure of which is hereby incorporated by reference herein.

TECHNICAL FIELD

Embodiments of the disclosure generally relate to semiconductor devices. More particularly, embodiments of the disclosure are directed to gate-all-around (GAA) devices, FinFET devices, and CFET devices including dielectric material instead of a silicon substrate in order to form the isolation module in backside power delivery applications.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a gate all around (GAA) structure. The GAA device structure includes several lattice matched channels suspended in a stacked configuration and connected by source/drain regions. The GAA structure provides good electrostatic control and can find broad adoption in complementary metal oxide semiconductor (CMOS) wafer manufacturing.

In the backside power delivery (BSPDN) architecture, the silicon (Si) substrate needs to be replaced with a dielectric material so that there is no shorting mechanism between adjacent contacts. Since the direct backside contact requires silicon germanium (SiGe) as a placeholder, however, removing silicon (Si) selective to silicon germanium (SiGe) is extremely difficult. Accordingly, there is a need for improved semiconductor devices and methods of manufacture.

SUMMARY

One or more embodiments of the disclosure are directed to methods of forming a semiconductor device. In one or more embodiments, a method of forming a semiconductor device comprises: recessing a sacrificial layer relative to a silicon layer of a substrate to form a recessed region, the substrate formed on a channel including a superlattice structure, the superlattice structure on a shallow trench isolation on the substrate and the channel on a gate; isotropically etching the silicon layer to form a first opening; depositing a cap layer in the first opening; removing the silicon layer to form a second opening; depositing a flowable layer in the second opening; removing the cap layer and the sacrificial layer to form a third opening; and forming a backside contact metallization in the third opening.

Additional embodiments of the disclosure are directed to methods of forming a semiconductor device. In one or more embodiments, a method of forming a semiconductor device comprises: recessing a sacrificial layer relative to a silicon layer of a substrate to form a recessed region, the substrate formed on a channel including a superlattice structure, the superlattice structure on a shallow trench isolation on the substrate and the channel on a gate; isotropically etching the silicon layer to form a first opening; depositing a cap layer in the first opening; partially removing the silicon layer to form a second opening; oxidizing the remaining silicon layer to form an oxidized silicon layer; optionally depositing a conformal liner in the second opening; depositing a flowable layer on the in the second opening on the oxidized silicon layer or on the optional conformal liner; removing the cap layer and the sacrificial layer to form a third opening; and forming a backside contact metallization in the third opening.

Still further embodiments of the disclosure are directed to a semiconductor devices. In one or more embodiments, a semiconductor device comprises: a recessed a sacrificial layer of a substrate, the substrate formed on a channel including a superlattice structure, the superlattice structure on a shallow trench isolation on the substrate and the channel on a gate; a cap layer on the recessed sacrificial layer; and a flowable layer adjacent to the recessed sacrificial layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
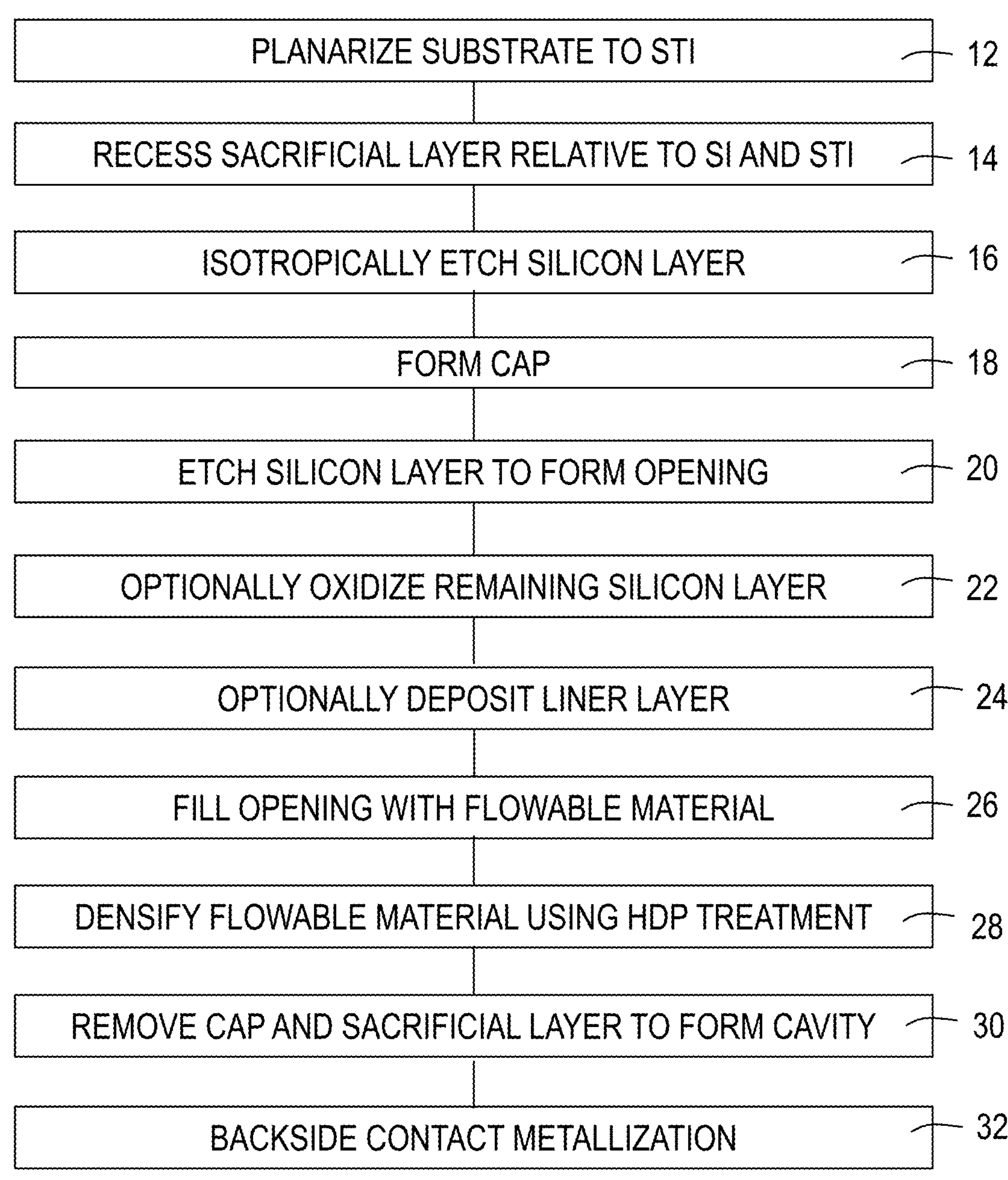
FIG. 1 is a process flow diagram of a method according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

"Epitaxy" is a process by which a deposited film is forced into a high degree of crystallographic alignment with the substrate. Epitaxial growth is broadly defined as the condensation of gas precursors to form a film on a substrate. Liquid precursors may also be used. Vapor precursors may be obtained by chemical vapor deposition (CVD) and laser ablation. Several epitaxy techniques are now available, such as molecular beam epitaxy (MBE), epitaxial CVD, or atomic layer epitaxy (ALE).

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

One example of gate-all-around (GAA) technology is complementary field effect transistor (CFET). As used herein, the term "complementary field-effect transistor (CFET)" refers to a transistor that includes NMOS FET devices and PMOS FET devices stacked on each other. Each of the NMOS FET devices and the PMOS FET devices that form the CFET are GAA transistors or hGAA transistors. CFET transistors have increased on-chip device density and reduced area consumption when compared to GAA transistors.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, transistors, e.g., gate all-around transistors, FinFETs, CFETS, and the like, are fabricated. One or more embodiments advantageously combines selective recess of a sacrificial layer and isotropic etching of a silicon layer in order to form a protective cap that will allow the silicon layer of the substrate to be etched without affecting the sacrificial layer. In one or more embodiments, the formation of a protective cap is essential.

FIG. 1 illustrates the process flow diagram for a method 10 for forming a semiconductor device in accordance with some embodiments of the present disclosure. FIGS. 2-11 depict the stages of fabrication of semiconductor structures in accordance with the process flow of FIG. 1.

The method 10 of forming a semiconductor device is described below with respect to FIGS. 2-11, FIGS. 2-11 are cross-sectional views of a semiconductor device (e.g., a GAA) according to one or more embodiments. The method 10 of FIG. 1 may be part of a multi-step fabrication process of a semiconductor device. Accordingly, the method 10 of FIG. 1 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, epitaxy, or any other suitable chamber used for the fabrication of a semiconductor device.

Referring to FIG. 1, the method 10 of forming a semiconductor device 100 begins at operation 12, by planarizing a silicon layer of a substrate to the shallow trench isolation (STI). At operation 14, the sacrificial layer is recessed relative to the silicon layer of the substrate and STI. At operation 16, the silicon substrate is isotropically etched. At operation 18, a cap is formed. At operation 20, the silicon layer of the substrate is etched to form an opening. At operation 22, optionally, the remaining silicon layer is oxidized. At operation 24, a liner layer is optionally deposited in the opening. At operation 26, the opening is filled with a flowable material. At operation 28, the flowable material is densified using a high-density plasma (HDP) treatment. At operation 30, the cap and sacrificial layer are removed to form a cavity. At operation 32, the cavity is filled with backside contact metallization.

Referring to FIGS. 2 through 11, in one or more embodiments, at least one superlattice structure 101 is formed on a substrate 102. The superlattice structure 101 comprises a plurality of semiconductor material layers and a corresponding plurality of horizontal channel layers alternatingly arranged in a plurality of stacked pairs 116. In some embodiments the plurality of stacked groups of layers comprises a silicon (Si) and silicon germanium (SiGe) group. In some embodiments, the plurality of semiconductor material layers comprise silicon germanium (SiGe), and the plurality of horizontal channel layers comprise silicon (Si). In other embodiments, the plurality of horizontal channel layers comprise silicon germanium (SiGe), and the plurality of semiconductor materials layers comprise silicon (Si).

In some embodiments, the plurality of semiconductor material layers and corresponding plurality of horizontal channel layers can comprise any number of lattice matched material pairs suitable for forming a superlattice structure 101. In some embodiments, the plurality of semiconductor material layers and corresponding plurality of horizontal channel layers comprise from about 2 to about 50 pairs of lattice matched materials.

In one or more embodiments, the thickness of the plurality of semiconductor material layers and the plurality of horizontal channel layers are in the range of from about 2 nm to about 50 nm, in the range of from about 3 nm to about 20 nm, or in a range of from about 2 nm to about 15 nm.

Figures 2, 3:
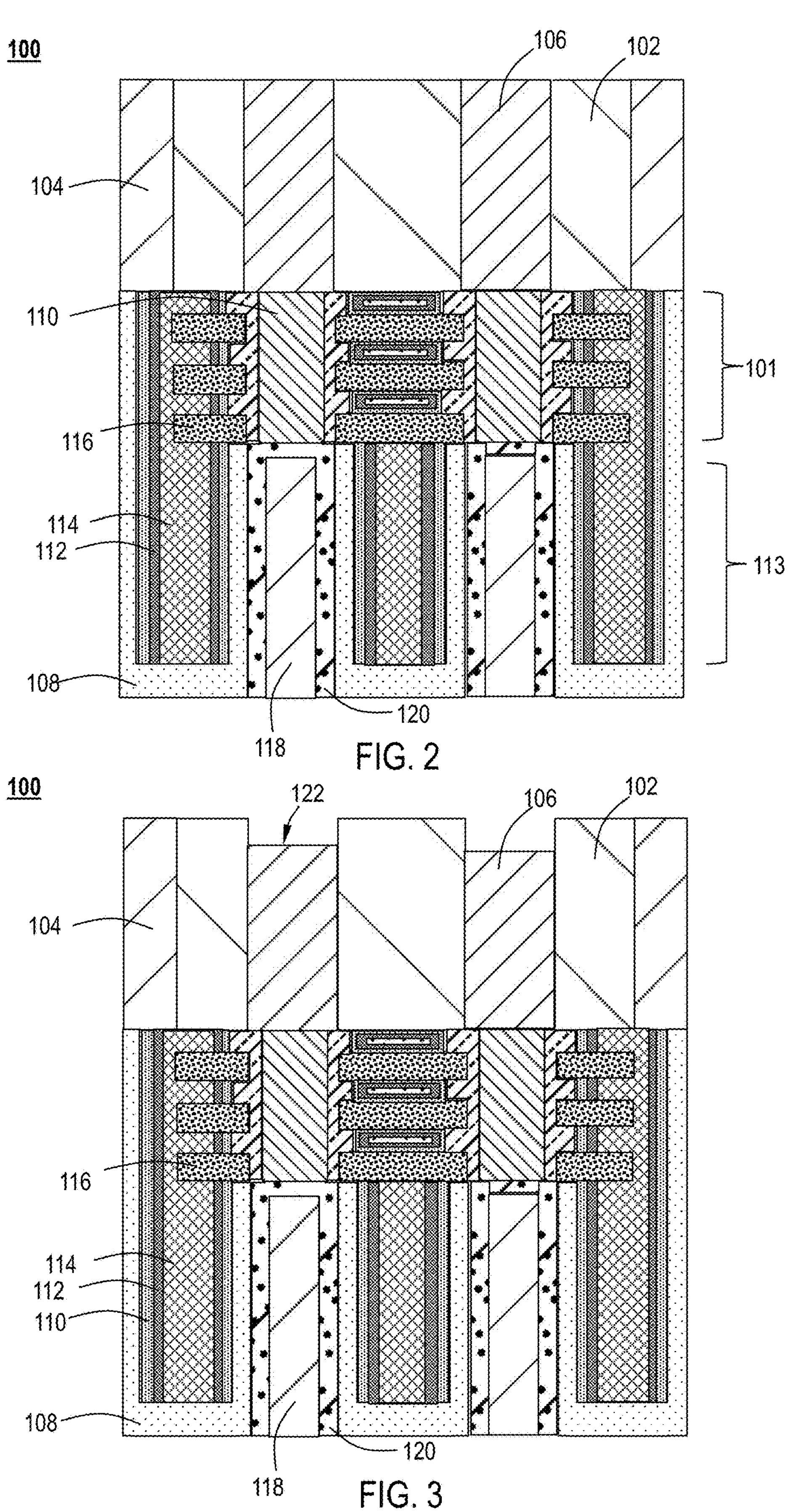
FIG. 2 illustrates a cross-section view of a semiconductor device according to one or more embodiments.
FIG. 3 illustrates a cross-section view of a semiconductor device according to one or more embodiments.

Referring to FIG. 1 and FIG. 2, a shallow trench isolation (STI) 104 is formed adjacent to a substrate comprising a silicon layer 102 and a sacrificial layer 106. As used herein, the term "shallow trench isolation (STI)" refers to an integrated circuit feature which prevents current leakage. In one or more embodiments, STI is created by depositing one or more dielectric materials (such as silicon dioxide) to fill a trench or opening and removing the excess dielectric using a technique such as chemical-mechanical planarization.

With reference to FIGS. 2 through 11, in some embodiments, a dummy gate structure 113 is formed adjacent to the superlattice structure 101. The dummy gate structure 113 defines the channel region of the transistor device. The dummy gate structure 113 may be formed using any suitable conventional deposition and patterning process known in the art.

In one or more embodiments, the dummy gate structure 113 comprises one or more of a gate material 114 and a poly-silicon layer 112. In one or more embodiments, the gate material 114 may comprise any suitable material known to the skilled artisan. In one or more embodiments, the gate material 114 comprises one or more of tungsten (W), cobalt (Co), molybdenum (Mo), ruthenium (Ru), titanium nitride (TiN), tantalum nitride (TaN), titanium aluminum (TiAl), and n-doped polysilicon. In some embodiments, the dummy gate structure 113 may also include a dielectric layer between the superlattice structure and the poly-silicon layer 112.

Referring to FIGS. 2 through 11, in one or more embodiments, source/drains 110 are formed adjacent (i.e., on either side) the superlattice structure 101. In some embodiments, the source 110 region is formed adjacent to the first end of the superlattice structure 101 and the drain 110 is formed adjacent a second, opposing end of the superlattice structure 101. In some embodiments, the source/drain 110 regions are formed from any suitable semiconductor material, such as but not limited to silicon (Si), germanium (Ge), silicon germanium (SiGe), silicon phosphorous (SiP), silicon arsenic (SiAs), or the like. In some embodiments, the source/drain 110 regions may be formed using any suitable deposition process, such as an epitaxial deposition process. In some embodiments, the source/drain 110 regions are independently doped with one or more of phosphorus (P), arsenic (As), boron (B), and gallium (Ga).

With reference to FIG. 1 and FIG. 2, at operation 12, the substrate 102 is planarized to the shallow trench isolation 104. The planarization may be any suitable planarization process known to the skill artisan including, but not limited to, chemical mechanical planarization (CMP).

In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), strained silicon, doped or undoped silicon wafers, patterned or non-patterned wafers, doped silicon, or other suitable semiconducting materials. In some embodiments, the semiconductor material is silicon (Si). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor substrate 102 material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

In one or more embodiments, a sacrificial layer 106 is adjacent to the semiconductor substrate 102 material. The sacrificial layer 106 may comprise any suitable material known to the skilled artisan. In some embodiments, the sacrificial layer comprises one or more of silicon germanium (SiGe), a metal, amorphous carbon, and the like. In specific embodiments, the sacrificial layer comprises silicon germanium (SiGe).

With reference to FIGS. 1 and 3, at operation 14, the sacrificial layer 106 is recessed relative to the silicon layer 102 of the substrate to form a recessed region 122. In one or more embodiments, the recessed region 122 has a depth in a range of from 2 nm to 50 nm, or in a range of from 2 nm to 40 nm, or in a range of from 2 nm to 30 nm, or in a range of from 2 nm to 20 nm, or in a range of from 2 nm to 15 nm, or in a range of from 2 nm to 10 nm, or in a range of from 2 nm to 7 nm, or in a range of from 2 nm to 5 nm.

Figures 4, 5:
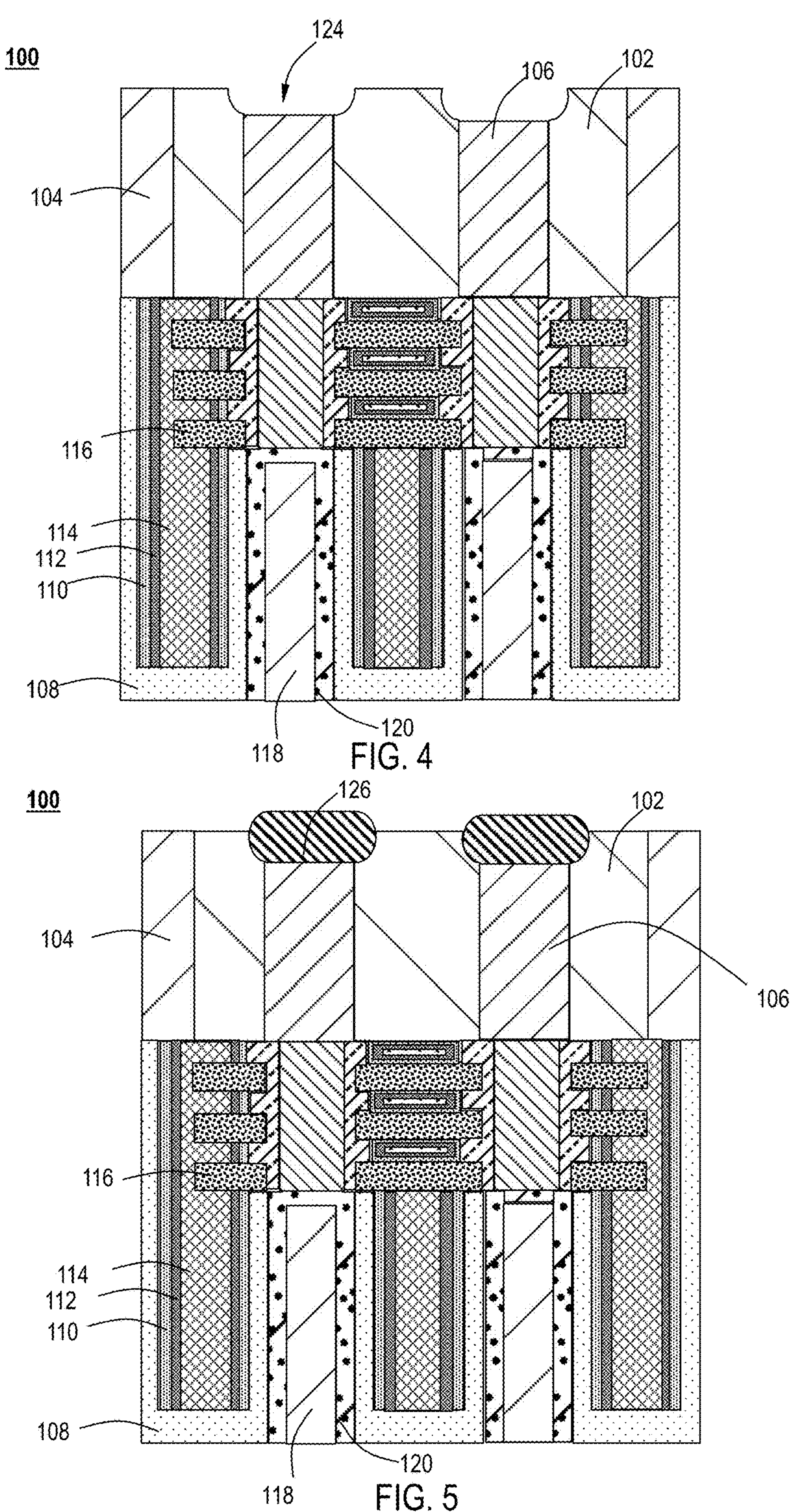
FIG. 4 illustrates a cross-section view of a semiconductor device according to one or more embodiments.
FIG. 5 illustrates a cross-section view of a semiconductor device according to one or more embodiments.

Referring to FIGS. 1 and 4, at operation 16, the silicon layer 102 is isotropically etched to form an opening 124 which includes the recessed region 122 and an etched portion of the silicon layer 102. In one or more embodiments, the opening 124 has a critical dimension (CD) in a range of from 2 nm to 60 nm, including in a range of from 2 nm to 50 nm, including a range of from 2 nm to 40 nm, including in a range of from 2 nm to 30 nm, including in a range of from 2 nm to 25 nm, including in a range of from 2 nm to 20 nm, including in a range of from 2 nm to 15 nm, including in a range of from 2 nm to 10 nm, and including in a range of from 2 nm to 5 nm.

With reference to FIGS. 1 and 5, at operation 18, a cap layer 126 is deposited in the opening 124. The cap layer may comprise any suitable material known to the skilled artisan. In one or more embodiments, the cap layer comprises one or more of silicon nitride (SiN), amorphous carbon, silicon oxynitride (SiON), aluminum oxide (AlOx), and the like.

Figures 6, 7:
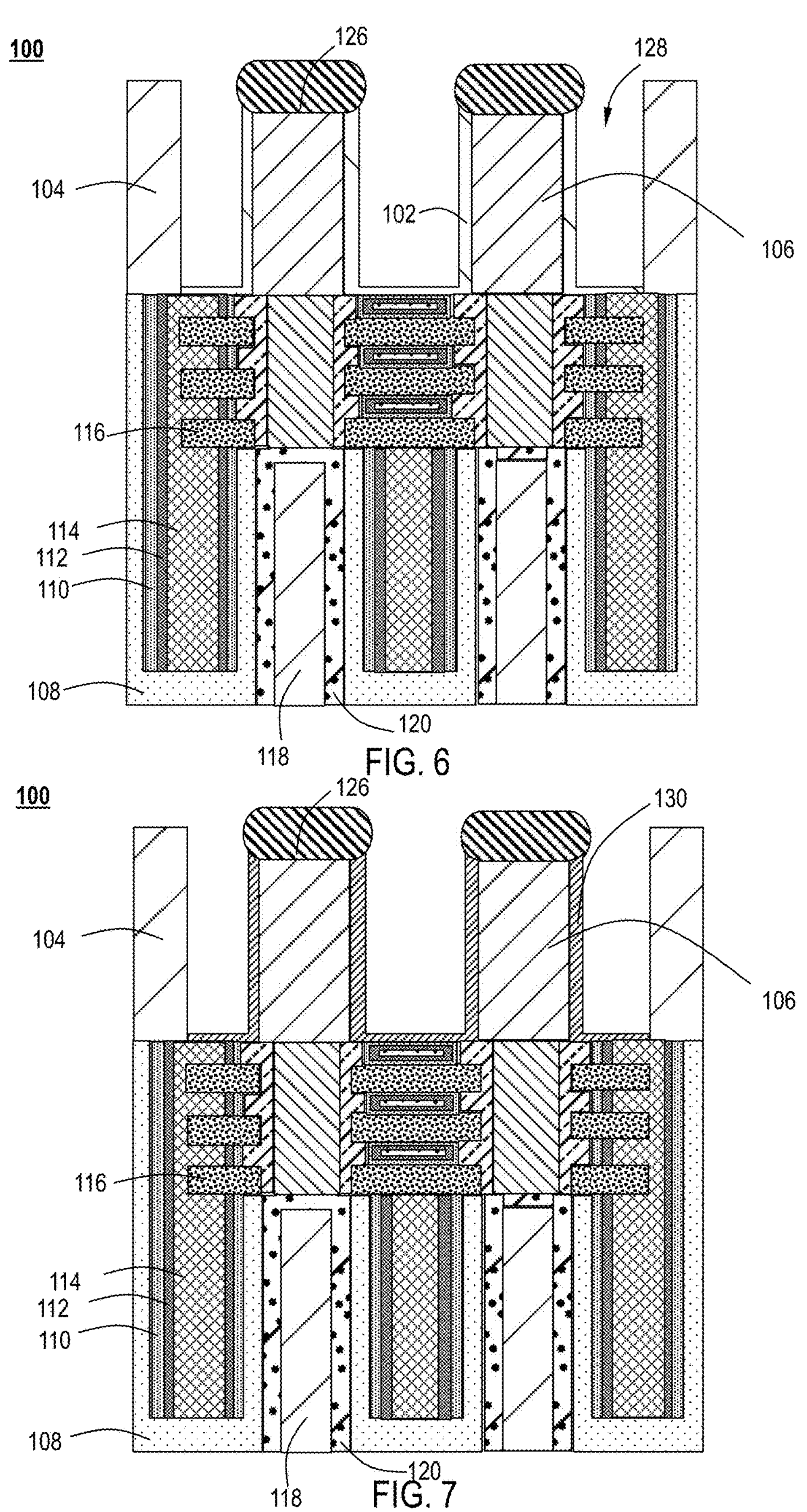
FIG. 6 illustrates a cross-section view of a semiconductor device according to one or more embodiments.
FIG. 7 illustrates a cross-section view of a semiconductor device according to one or more embodiments.

Referring to FIGS. 1 and 6, at operation 20, the silicon layer 102 is etched to form an opening 128. In some embodiments, the silicon layer 102 is completely removed by SRP etching to form opening 128. In other embodiments, as illustrated in FIG. 6, the silicon layer 102 is anisotropically etched such that a portion of the silicon layer 102 remains. Any suitable thickness of the silicon oxide layer 102 may remain. In one or more embodiments, the portion of silicon oxide layer 102 that is remaining has a thickness in a range of from 3 nm to 5 nm.

The opening 128 may be formed by any suitable means known to the skilled artisan. In some embodiments the etch process of operation 20 comprises one or more of a wet etch process or a dry etch process. The etch process may be a directional etch.

In some embodiments, the dry etch process may include a conventional plasma etch, or a remote plasma-assisted dry etch process. In a remote plasma-assisted dry etch process according to one or more embodiments, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The remote plasma-assisted dry etch process may be performed in a preclean chamber, which may be integrated into one of a variety of multi-processing platforms know to the skilled artisan. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

With reference to FIGS. 1 and 7, at operation 22, the portion of the silicon layer 102 that remains may be oxidized to form an oxidized layer 130. The portion of the silicon layer 102 that remains may be oxidized by any suitable method known to the skilled artisan. In one or more embodiments, the remaining silicon layer 102 may be oxidized using a rapid thermal oxidation (RTO) process at a temperature of greater than 400° C.

Referring to FIG. 1, at operation 24, a conformal liner (not illustrated) prior is optionally deposited in the opening 128 on the oxidized layer 130. The conformal liner may comprise any suitable material known to the skilled artisan. In one or more embodiments, the conformal liner comprises one or more of silicon nitride (SiN), silicon oxynitride (SiON), silicon oxycarbide (SiOC), silicon oxy-carbon-nitride (SiOCN), and the like. The conformal liner may have any suitable thickness. In one or more embodiments, the conformal liner has a thickness in a range of from 1 nm to 20 nm.

Figures 8, 9:
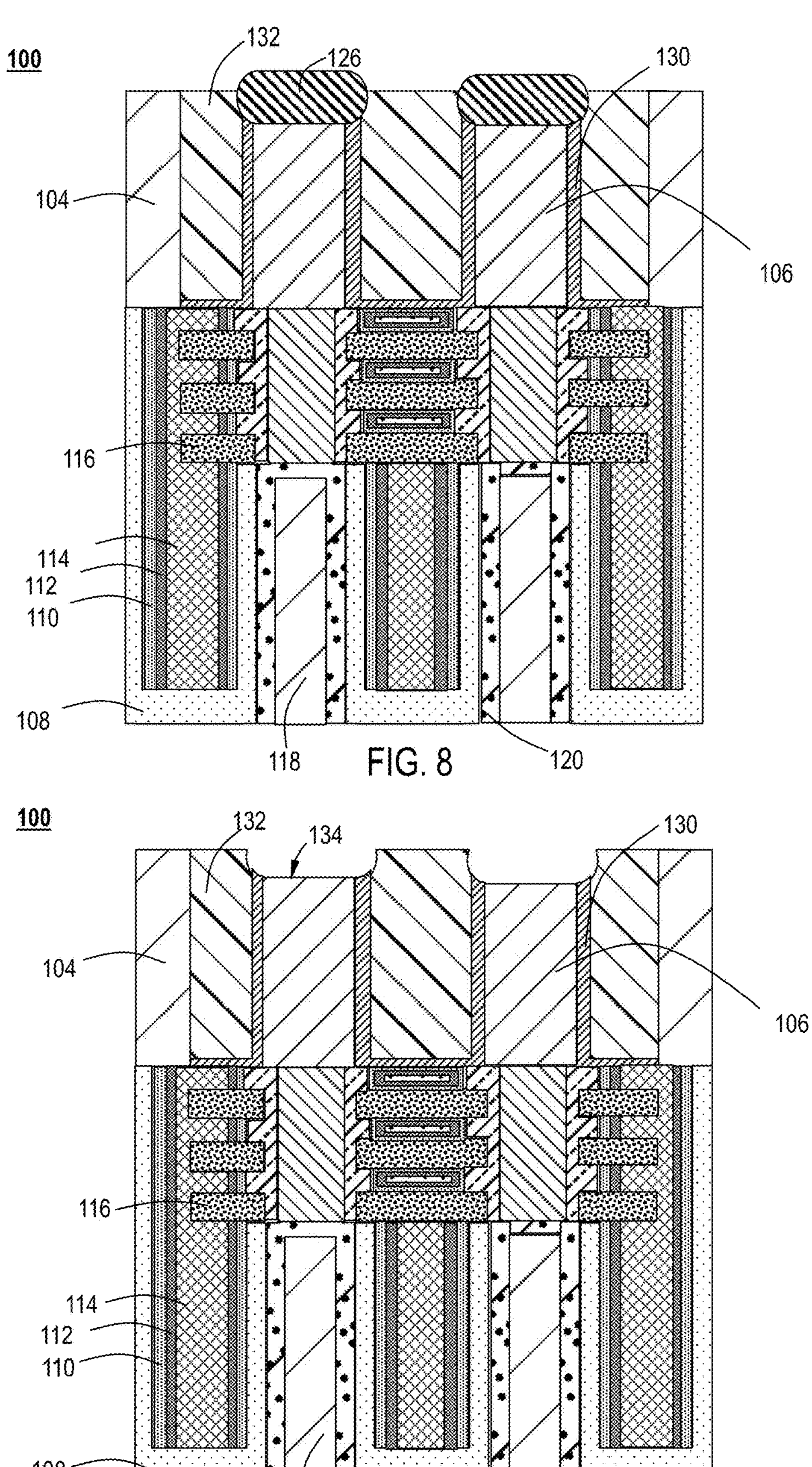
FIG. 8 illustrates a cross-section view of a semiconductor device according to one or more embodiments.
FIG. 9 illustrates a cross-section view of a semiconductor device according to one or more embodiments.

With reference to FIGS. 1 and 8, at operation 26, a flowable material 132 is deposited in the opening 128. In embodiments where a conformal liner is first deposited at operation 24, the flowable material 132 is deposited in the opening 128 on the conformal liner. The flowable material 132 may comprise any suitable flowable material known to the skilled artisan. In one or more embodiments, the flowable material 132 comprises one or more of silicon oxide (SiOx), silicon oxynitride (SiON), silicon oxycarbide (SiOC), silicon nitride (SiN), silicon oxy-carbonitride (SiOCN), and the like. In one or more specific embodiment, the flowable material 132 comprises silicon oxide (SiOx).

In one or more unillustrated embodiments, at operation 28 of FIG. 1, the flowable material 132 is densified using a high-density plasma (HDP) treatment and is then planarized, e.g., chemical mechanical polishing (CMP), to form a top surface that is even with the STI layer 104.

With reference to FIGS. 1 and 9, at operation 30, the cap layer 126 is removed to form an opening 134. The opening 134 exposes a top surface of the sacrificial layer 106.

Figures 10, 11:
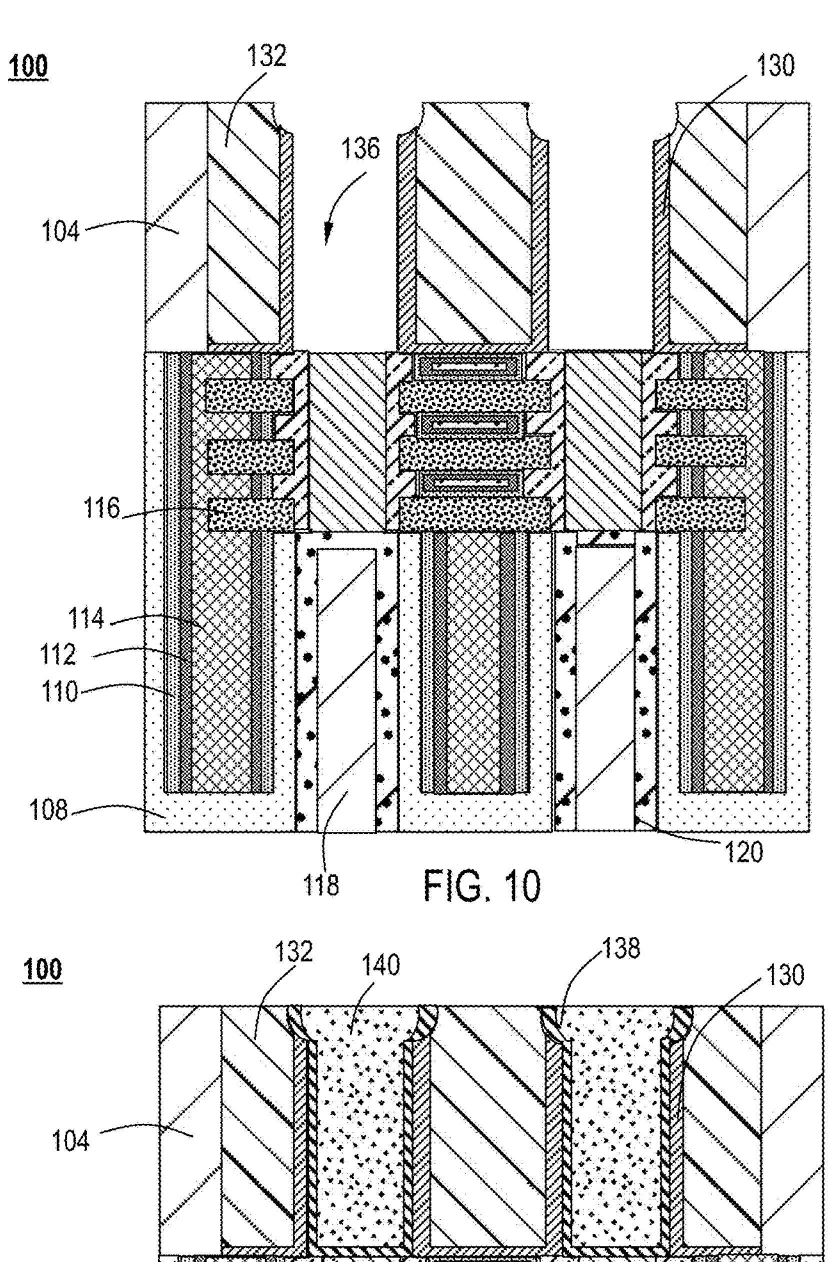
FIG. 10 illustrates a cross-section view of a semiconductor device according to one or more embodiments.
FIG. 11 illustrates a cross-section view of a semiconductor device according to one or more embodiments.

As illustrated in FIGS. 1 and 10, at operation 30, the sacrificial layer 106 is removed to form cavity 136. The cavity 136 may be shaped and processed as needed.

Referring to FIGS. 1 and 11, at operation 32, backside contact metallization is then performed, wherein one or more of a metal liner 138 and metal fill 140 may be deposited. The backside contact metallization may comprise any suitable material known to the skilled artisan. In one or more embodiments, the backside contact metallization, e.g., metal liner 138 and metal fill 140, may comprise one or more of tungsten (W), molybdenum (Mo), titanium nitride (TiN), tantalulm nitride (TaN), cobalt (Co) ruthenium (Ru), and copper (Cu).

In one or more embodiments, the method 10 of FIG. 1 produces a gate-all-around (GAA device). An intermediate device includes a recessed a sacrificial layer 106 of a substrate. The substrate is formed on a channel including a superlattice structure 101, the superlattice structure 101 is on a shallow trench isolation 104 on the substrate and the channel is on a gate 113. In one of more embodiments, a cap layer 126 is on the recessed sacrificial layer 106. A flowable layer 132 is adjacent to the recessed sacrificial layer 106. After the cap layer 126 and the recessed sacrificial layer 106 are removed, backside contact metallization 138, 140 are formed.

Figure 12:
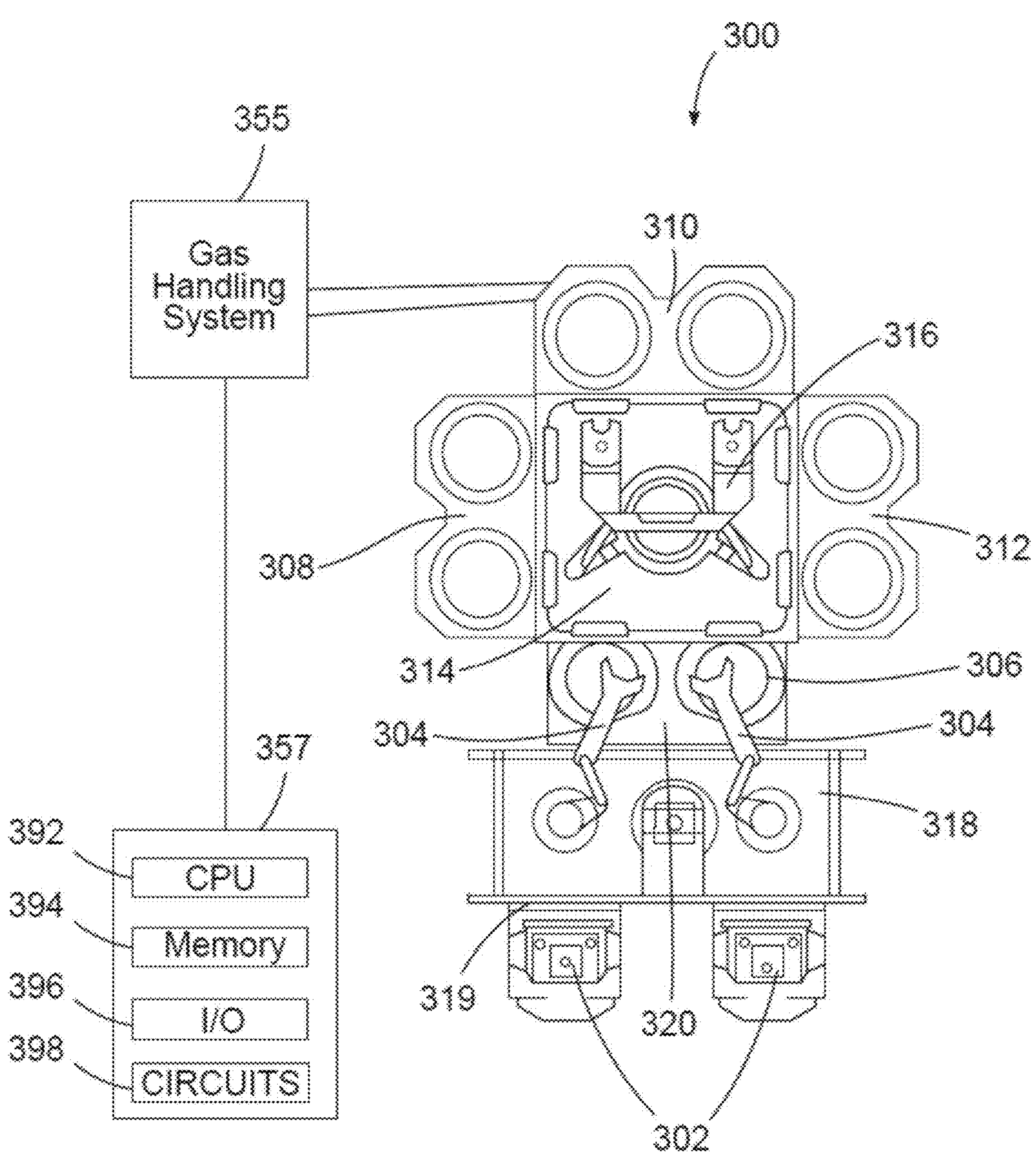
FIG. 12 illustrates a cluster tool according to one or more embodiments.

Additional embodiments of the disclosure are directed to processing tools 300 for the formation of the GAA devices and methods described, as shown in FIG. 12. A variety of multi-processing platforms known to the skilled artisan may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber, an etching chamber, and the like. The particular arrangement of process chambers and components can be varied depending on the cluster tool and should not be taken as limiting the scope of the disclosure.

In the embodiment shown in FIG. 12, a factory interface 318 is connected to the front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the rapid thermal processing chamber to crystallize the template material.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a recessing chamber, an etching chamber, a deposition chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
- recessing a sacrificial layer relative to a silicon layer of a substrate to form a recessed region, the substrate formed on a channel including a superlattice structure, the superlattice structure on a shallow trench isolation on the substrate and the channel on a gate;
- isotropically etching the silicon layer to form a first opening;
- depositing a cap layer in the first opening;
- removing at least a portion of the silicon layer to form a second opening;
- depositing a flowable layer in the second opening;
- removing the cap layer and the sacrificial layer to form a third opening; and
- forming a backside contact metallization in the third opening.

2. The method of claim 1, wherein the silicon layer is removed completely.

3. The method of claim 1, further comprising depositing a conformal liner prior to deposition of the flowable layer, the conformal liner comprising one or more of silicon nitride, silicon oxynitride, silicon oxycarbide, silicon oxy-carbon-nitride, and having a thickness in a range of from 1 nm to 20 nm.

4. The method of claim 1, wherein the silicon layer is only partially removed, and a portion of silicon layer remains.

5. The method of claim 4, further comprising oxidizing the remaining silicon layer.

6. The method of claim 1, wherein the superlattice structure comprises a plurality of horizontal channel layers and a corresponding plurality of semiconductor material layers alternatingly arranged in a plurality of stacked pairs.

7. The method of claim 1, wherein the sacrificial layer comprises one or more of silicon germanium (SiGe), a metal, amorphous carbon, and the like.

8. The method of claim 1, wherein the cap layer comprises one or more of silicon nitride (SiN), amorphous carbon, silicon oxynitride (SiON), aluminum oxide (AlOx), and the like.

9. The method of claim 1, wherein the recessed region has a depth in a range of from 2 nm to 30 nm, and wherein the first opening has a critical dimension in a range of from 2 nm to 60 nm.

10. The method of claim 1, wherein the gate comprises one or more of tungsten (W), cobalt (Co), molybdenum (Mo), ruthenium (Ru), titanium nitride (TiN), tantalum nitride (TaN), titanium aluminum (TiAl), and n-doped polysilicon, and wherein the flowable layer comprises one or more of silicon oxide (SiOx), silicon oxynitride (SiON), silicon oxycarbide (SiOC), silicon nitride (SiN), silicon oxy-carbon-nitride (SiOCN), and the like.

11. The method of claim 1, wherein the method is performed in a processing chamber without breaking vacuum.

12. The method of claim 1, wherein the backside contact metallization comprises one or more of tungsten (W), molybdenum (Mo), titanium nitride (TiN), tantalulm nitride (TaN), cobalt (Co) ruthenium (Ru), and copper (Cu).

13. The method of claim 1, wherein the semiconductor device comprises one or more of a gate-all-around, a Fin-FET, and CFET.

14. A method of forming a semiconductor device, the method comprising:
- recessing a sacrificial layer relative to a silicon layer of a substrate to form a recessed region, the substrate formed on a channel including a superlattice structure, the superlattice structure on a shallow trench isolation on the substrate and the channel on a gate;

isotropically etching the silicon layer to form a first opening;

depositing a cap layer in the first opening;

partially removing the silicon layer to form a second opening;

oxidizing the remaining silicon layer to form an oxidized silicon layer;

optionally depositing a conformal liner in the second opening;

depositing a flowable layer on the in the second opening on the oxidized silicon layer;

removing the cap layer and the sacrificial layer to form a third opening; and forming a backside contact metallization in the third opening.

15. The method of claim 14, wherein the recessed region has a depth in a range of from 2 nm to 30 nm.

16. The method of claim 15, wherein the first opening has a critical dimension in a range of from 2 nm to 60 nm.

17. The method of claim 14, wherein the sacrificial layer comprises one or more of silicon germanium (SiGe), a metal, amorphous carbon, and the like, wherein the cap layer comprises one or more of silicon nitride (SiN), amorphous carbon, silicon oxynitride (SiON), aluminum oxide (AlOx), and the like, wherein the flowable layer comprises one or more of silicon oxide (SiOx), silicon oxynitride (SiON), silicon oxycarbide (SiOC), silicon nitride (SiN), silicon oxy-carbonitride (SiOCN), and the like, and wherein the backside contact metallization comprises one or more of tungsten (W), molybdenum (Mo), titanium nitride (TiN), tantalulm nitride (TaN), cobalt (Co) ruthenium (Ru), and copper (Cu).

18. A semiconductor device comprising:

a recessed a sacrificial layer of a substrate, the substrate formed on a channel including a superlattice structure, the superlattice structure on a shallow trench isolation on the substrate and the channel on a gate, the sacrificial layer comprising one or more of silicon germanium (SiGe), a metal, amorphous carbon, and the like;

a cap layer on the recessed sacrificial layer, the cap layer comprising one or more of silicon nitride (SiN), amorphous carbon, silicon oxynitride (SiON), aluminum oxide (AlOx), and the like; and a flowable layer adjacent to the recessed sacrificial layer, the flowable layer comprising one or more of silicon oxide (SiOx), silicon oxynitride (SiON), silicon oxycarbide (SiOC), silicon nitride (SiN), silicon oxy-carbon-nitride (SiOCN), and the like.

19. The device of claim 18, further comprising a conformal liner prior adjacent to the flowable layer, the conformal liner comprising one or more of silicon nitride, silicon oxynitride, silicon oxycarbide, silicon oxy-carbonitride (SiOCN), and having a thickness in a range of from 1 nm to 20 nm.

20. The device of claim 18, wherein the semiconductor device comprises one or more of a gate-all-around, a FinFET, and a CFET.

* * * * *